(12) United States Patent
Hébert

(10) Patent No.: US 7,851,286 B2
(45) Date of Patent: Dec. 14, 2010

(54) BOTTOM SOURCE LDMOSFET METHOD

(75) Inventor: François Hébert, San Mateo, CA (US)

(73) Assignee: Alpha & Omega Semiconductor, Ltd (BM)

( * ) Notice: Subject to any disclaimer, the term of this patent is extended or adjusted under 35 U.S.C. 154(b) by 0 days.

(21) Appl. No.: 12/456,949

(22) Filed: Jun. 25, 2009

(65) Prior Publication Data

US 2009/0263947 A1  Oct. 22, 2009

Related U.S. Application Data

(62) Division of application No. 11/495,803, filed on Jul. 28, 2006, now Pat. No. 7,554,154.

(51) Int. Cl.
*H01L 21/336* (2006.01)
(52) U.S. Cl. .................. 438/197; 438/229; 438/233; 257/E21.409
(58) Field of Classification Search ............ 438/197, 438/229, 233; 257/E21.409
See application file for complete search history.

(56) References Cited

U.S. PATENT DOCUMENTS

| 5,473,180 | A  | * | 12/1995 | Ludikhuize | 257/336 |
| 6,506,648 | B1 | * | 1/2003 | Hebert et al. | 438/286 |
| 6,727,127 | B1 | * | 4/2004 | Darmawan et al. | 438/197 |
| 7,061,057 | B2 | * | 6/2006 | Babcock et al. | 257/401 |

* cited by examiner

*Primary Examiner*—Tuan N. Quach
(74) *Attorney, Agent, or Firm*—Bo-In Lin

(57) ABSTRACT

This invention discloses a method to form a bottom-source lateral diffusion MOS (BS-LDMOS) device with a source region disposed laterally opposite a drain region near a top surface of a semiconductor substrate supporting a gate thereon between the source region and a drain region. The method includes a step of applying a sinker-channel mask for carrying out a deep sinker multiple energy implant to form a combined sinker-channel region in lower portion of an epitaxial layer to function as a buried source-body contact extending to and contacting a bottom of the substrate functioning as a bottom source electrode.

6 Claims, 17 Drawing Sheets

BOTTOM SOURCE LDMOSFET METHOD

This patent application is a Divisional application and claims the Priority Date of a application Ser. No. 11/495,803 filed on Jul. 28, 2006 now U.S. Pat. No. 7,554,154 by common Inventors of this application. The Disclosures made in the patent application Ser. No. 11/495,803 are hereby incorporated by reference.

BACKGROUND OF THE INVENTION

1. Field of the Invention

The invention relates generally to the semiconductor power devices. More particularly, this invention relates to a bottom-source lateral diffusion metal oxide semiconductor field effect transistor (LDMOSFET) structure and manufacturing methods.

2. Description of the Prior Art

Conventional technologies to further reduce the source inductance for semiconductor power devices including the source inductance in FET, MOSFET and JFET devices are challenged by several technical difficulties and limitations. There are ever increasing demand to reduce the source inductance in the semiconductor power devices because more and more power devices are required to apply in the applications that demand high efficiency, high gain, and high frequency semiconductor power devices. The source inductance reduction can be achieved by eliminating the bond-wires in the package of a semiconductor power device. Many attempts are made to eliminate the bond-wires by configure the semiconductor substrate as a source connection for the semiconductor power devices. There are difficulties in such approaches due to the facts that typical vertical semiconductor power devices is arranged to place the drain electrode on the substrate. Referring to FIGS. 1A and 1B for the vertical power devices shown as trenched and planar DMOS devices respectively that use the substrate as the drain electrode with the current flows vertically from the source down to the drain region disposed at the bottom of the substrate. The top source electrode usually requires bond wires for electrical connections during a device packaging process thus increasing the source inductance.

Referring to FIG. 1C for a new vertical channel LDMOS device disclosed by Seung-Chul Lee et al, in Physica Cripta T101, pp. 58-60, 2002, with a structure shown as a standard vertical trenched DMOS wherein the drain contact is disposed on the side while the source is still on top of the active area. However, this device has a limitation due to a large cell pitch caused by the lateral spacing required by the top drain contact. In addition to the limitation of large cell pitch, the trenched FET device in general has a fabrication cost issue due to the fact that the trenched FET requires technologies that may not be available in all foundries and that tend to drive up the fabrication costs. For this reason, it is also desirable to implement the power device as lateral device with planar gate.

Several lateral DMOS with grounded substrate source have been disclosed. A lateral DMOS device typically includes a P+ sinker region (or alternate a trench) to connect the top source to the P+ substrate. The sinker region or the trench increases the pitch of the cell due to the dimensions occupied by the sinker or the trench. Referring to FIG. 1D for a device cross section disclosed by G. Cao et. al, in "Comparative Study of Drift Region Designs in RF LDMOSFETs", IEEE Electron Devices, August 2004, pp 1296-1303. Ishiwaka O et al; disclose in "A 2.45 GHz power Ld-MOFSET with reduced source inductance by V-groove connections", International Electron Devices Meeting. Technical Digest, Washington, D.C., USA, 1-4 Dec. 1985, pp. 166-169. In U.S. Pat. No. 6,372,557 by Leong (Apr. 16, 2002) attempts are made to use a buried layer at the interface of the P+ and P− epi layers to reduce the lateral diffusion and hence reduce pitch. In U.S. Pat. No. 5,821,144 (D'Anna and Hébert, Oct. 13, 1998) and U.S. Pat. No. 5,869,875, Hébert "Lateral Diffused MOS transistor with trench source contact" (issued on Feb. 9, 1999) devices are disclosed to reduce the cell pitch by placing the source sinker or trench on the OUTER periphery of the structure. However, in these disclosures, most of the devices as shown use the same metal over the source/body contact regions and gate shield regions and some of the devices use a second metal for drain and gate shield regions. These configurations generally form the P+ sinker through top down diffusion resulting in large cell pitch due to the significant lateral diffusions of the deep sinker diffusions used to connect the top source down to the highly doped substrate, that increases the overall size of the cell over the horizontal plane (cell pitch). A large cell pitch causes a large specific on-resistance which is a function of resistance and device areas. A large cell pitch also increases the device costs due to a larger size of the device and a larger size package.

Reducing the cell pitch of these prior art bottom-source devices results in shifts in the electrical performance of the device. For example, bringing the diffused sinker (which is p+ in doping) closer to the source side of the gate in FIG. 1D will result in a higher threshold voltage since the lateral diffusion of the diffused p+ sinker used to connect the top source to the bottom substrate will encroach in the channel region under the gate, which is also p-type, increase the doping concentration in the channel and hence, increase the threshold voltage, which is an undesirable result.

Therefore, a need still exists in the art of power semiconductor device design and manufacture to provide new device configurations and manufacturing method in forming the power devices such that the above discussed problems and limitations can be resolved.

SUMMARY OF THE PRESENT INVENTION

It is therefore an aspect of the present invention to provide a new and improved bottom-source lateral diffusion MOS (BS-LDMOS) semiconductor power device implemented with a combined sinker-channel and buried source-body contact. The device configuration has a reduce cell pitch and a planar structure compatible with many foundries for reducing fabrication costs such that the above discussed technical difficulties and limitations can be overcome.

Specifically, it is an aspect of the present invention to provide improved bottom-source lateral diffusion MOS (BS-LDMOS) semiconductor power device implemented with a combined sinker-channel and buried source-body contact that has a bottom substrate source connection such that the source inductance can be significantly reduced to achieve high efficiency, high gain and high frequency applications by the power device.

It is another aspect of the present invention to provide improved bottom-source lateral diffusion MOS (BS-LDMOS) semiconductor power device implemented with a combined sinker-channel and buried source-body contact that achieve low capacitance and low resistance by compensating some of the N dopant in the accumulation layer, away from the silicon surface, by a deep sinker implant through the lateral diffusion of the sinker region to the substrate below the drift region and the N-drain region.

It is another aspect of the present invention to provide improved bottom-source lateral diffusion MOS (BS-LD-MOS) semiconductor power device implemented with a combined sinker-channel and buried source-body contact that can be manufactured with self aligned process such that the cell pitch can be reduced and the mask requirements can be reduced to further reduce the fabrication costs for production of high quality and reliable semiconductor power devices.

It is another aspect of the present invention to provide improved bottom-source lateral diffusion MOS (BS-LD-MOS) semiconductor power device implemented with a combined sinker-channel and buried source-body contact that is rugged and highly reliable with reduced likelihood of latch-up, distributed body contact, reduced hot carrier injection and peak generation away from gate oxide, and other device damaging operational conditions such that the difficulties and limitations as that encountered in the prior art are resolved.

It is another aspect of the present invention to provide improved bottom-source lateral diffusion MOS (BS-LD-MOS) semiconductor power device implemented with a combined sinker-channel and buried source-body contact that is rugged and highly reliable such that the device configuration is much more scalable to compatibly operable with high and low voltage applications.

Briefly in a preferred embodiment this invention discloses a semiconductor power device configured as a bottom source lateral diffusion metal oxide field effect semiconductor (BS-LDMOS) device that includes an N-Drift region formed with surface blanket implant, a thick oxide over N-drift region (some embodiments) and a deep P+ Sinker form by multiple implant.

Furthermore, this invention discloses a method of manufacturing a bottom-source lateral diffusion MOS (BS-LD-MOS) device with a source region disposed laterally opposite a drain region near a top surface of a semiconductor substrate supporting a gate thereon the said source region and a drain region. The method includes a step of applying a sinker-channel mask for carrying out a deep sinker multiple energy implant to form a combined sinker-channel region in a lower portion of an epitaxial layer in the substrate to function as a buried source-body contact extending to and contacting a bottom of the substrate functioning as a bottom source electrode. The method further includes a step of blanket implanting a shallow drift region near a top surface of the substrate. The method further includes a step of forming a thick filed-oxide layer and forming the gate having a portion above the thick field-oxide layer whereby a gate capacitance is reduced.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
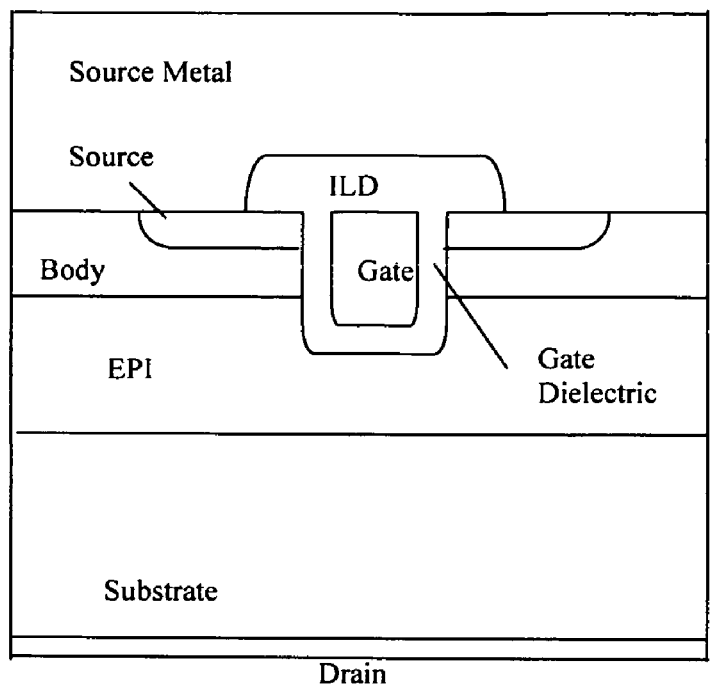
FIGS. 1A and 1B are cross sectional views for showing the typical vertical power device configurations implemented as a trenched-gate and planar-gate vertical power devices respectively.
Figure 1B:
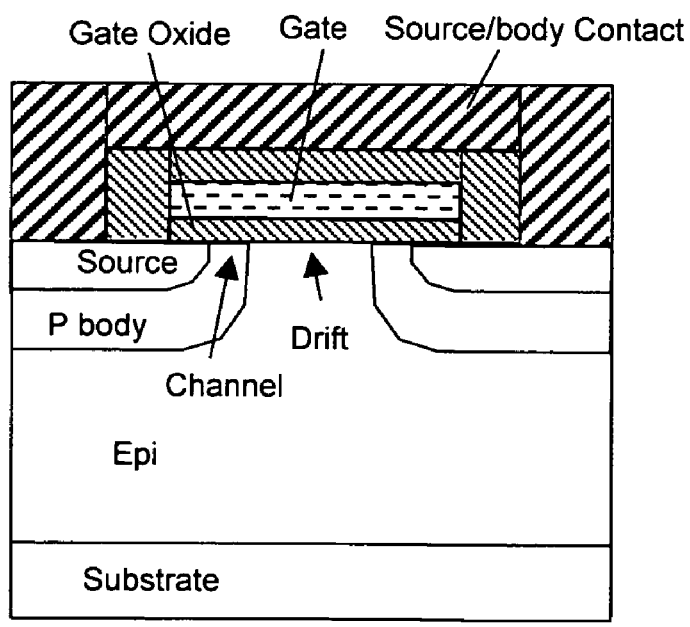
Figure 1C:
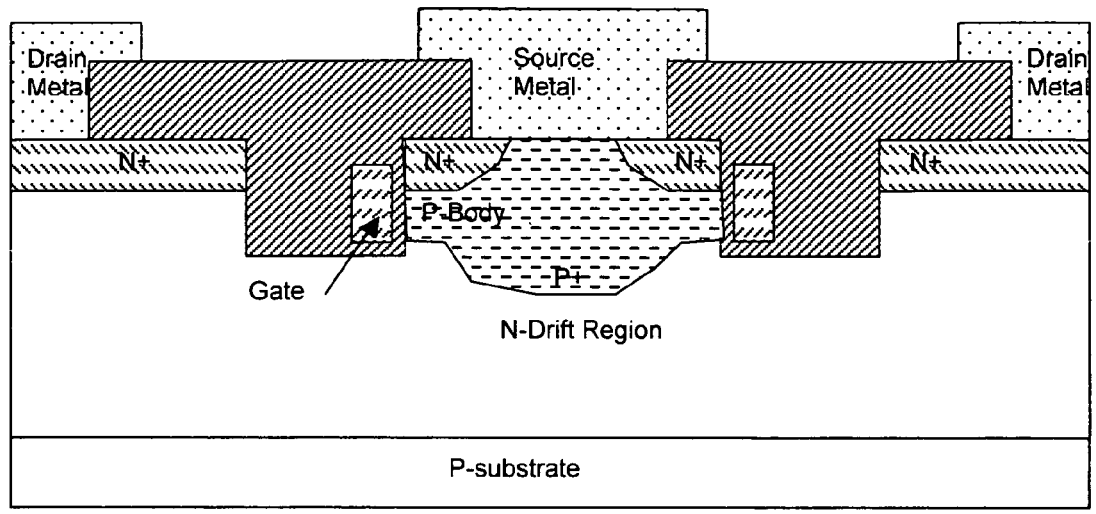
FIG. 1C is a cross sectional view of vertical channel LDMOS device.
Figure 1D:
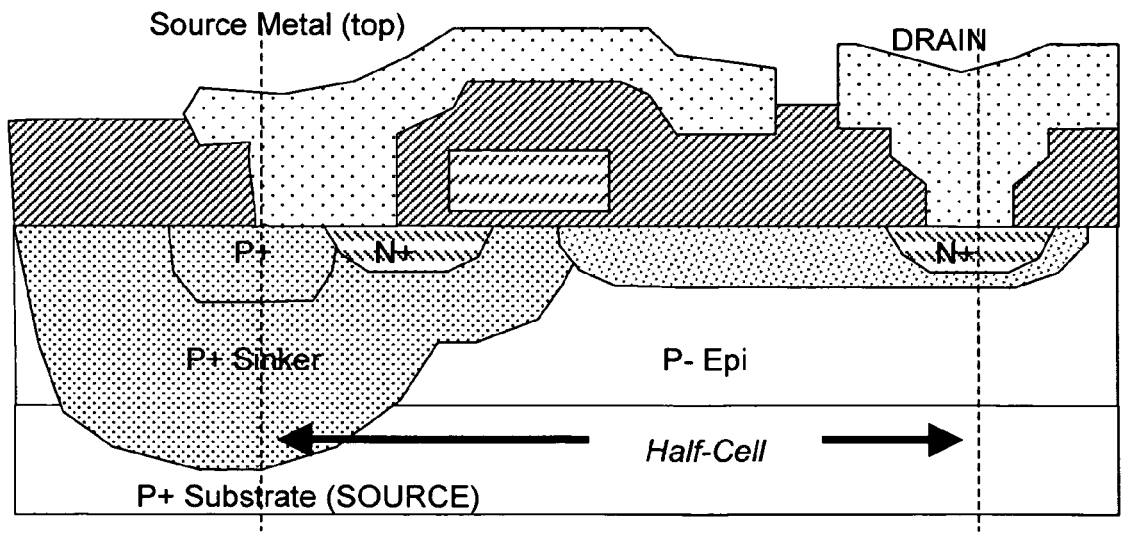
FIG. 1D is a cross sectional view of a drift region designs in a LDMOSFET device for RF application.
Figure 2:
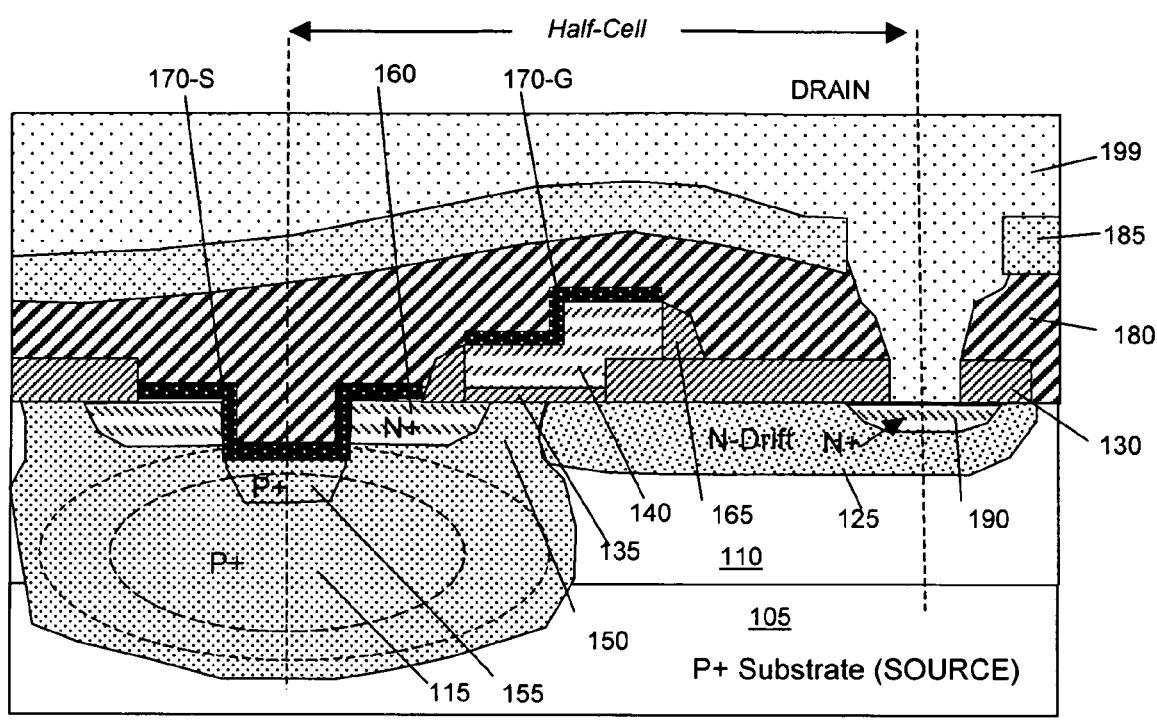
FIG. 2 is a cross sectional view of a trenched BSLDMOS device as a first embodiment of this invention.

Referring to FIG. 2 for a cross sectional view of a bottom source (BS) lateral diffusion MOS device of this invention. The BSLDMOS device is supported on a P+ substrate 105 functioning as a bottom source electrode. A layer of P-epitaxial layer 110 is supported on top of the substrate 105. A deep sinker region 115 doped with P+ dopant ions below an active cell area in the device is formed in the epitaxial layer at a depth and extended laterally to a bottom of a drain drift region 125 to compensate some of the N-dopant in the accumulation of the transistor for tailoring a dopant profile of N-drift region 125 to minimize the gate-drain capacitance while maintaining a low drain to source resistance Rdson. The deep sinker region 115 further extends vertically both downward to the bottom P+ substrate 105, and upward to a body region 150 that forms a channel at a top surface under a gate oxide 135. The sinker regions 115 functions as a combined channel and also as a buried source body contact for contacting to a P+ body contact region 155 that is formed near the top surface formed as a top trench covered by a source metal 170-S surrounded by N+ doped source region 160. A terrace-shaped gate 140 surrounded by a gate spacer 165 and covered by a gate shield metal 170-G is disposed above the gate oxide layer 135 formed on the top surface between the source region 160 and the drain drift region 125. The gate 140 thus controls the current flow between the source region 160 and the drain drift region 125 through the channel form by body region 150 under the gate 140 to function as a lateral MOS device. The drain region 125 is disposed below a field oxide 130 covered by a BPSG layer 180 and optionally a passivation layer 185. A drain contact opening is etched through the passivation layer 185 and the BPSG layer 180 for the top drain metal 199 to contact the drain region 125 via a contact N+ dopant region 190 with reduce contact resistance. The terrace-shaped oxide 130 and 135 below the terrace gate 140 as shown may be formed by different methods. The methods include the processes of growing or depositing the oxide and etching from the channel region or by using a LOCOS type of oxide deposition process. The terrace-shaped gate 140 has a longer gate length and field plating over the drain extension without increasing the cell pitch. The terrace gate 140 provides necessary link for current to flow between the channel and the drain under the gate oxide 135 and field oxide 130 with reduced gate-drain capacitance.

Figure 3:
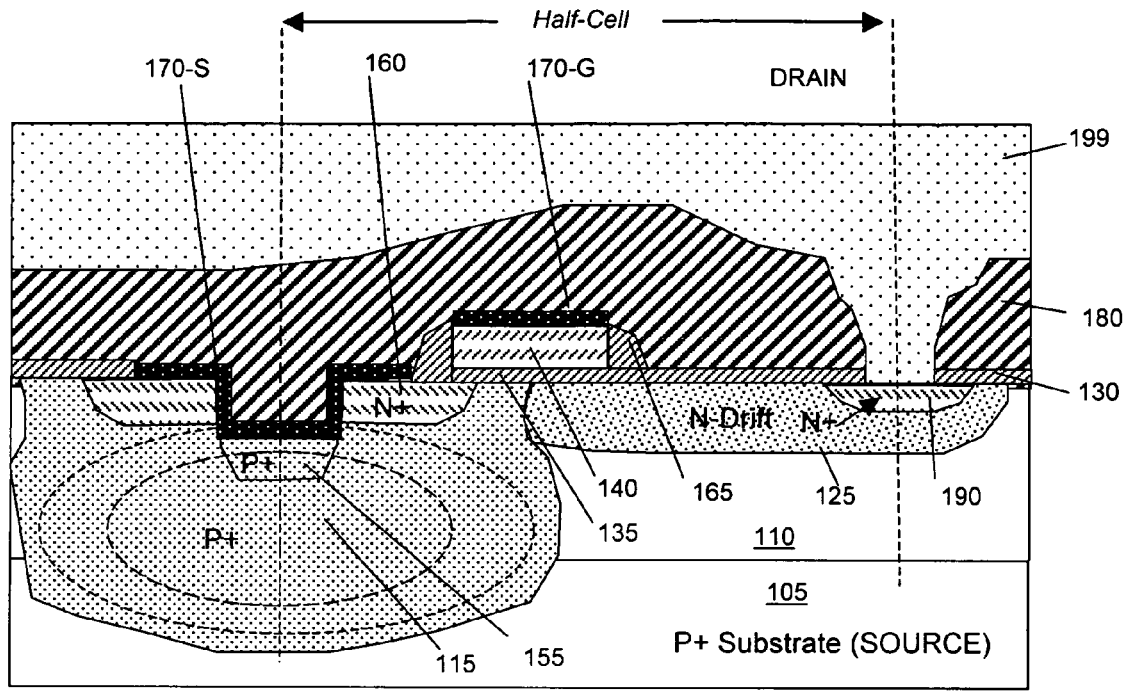
FIG. 3 is a cross sectional view of a planar short gate BSLDMOS device as another embodiment of this invention.
Figure 4:
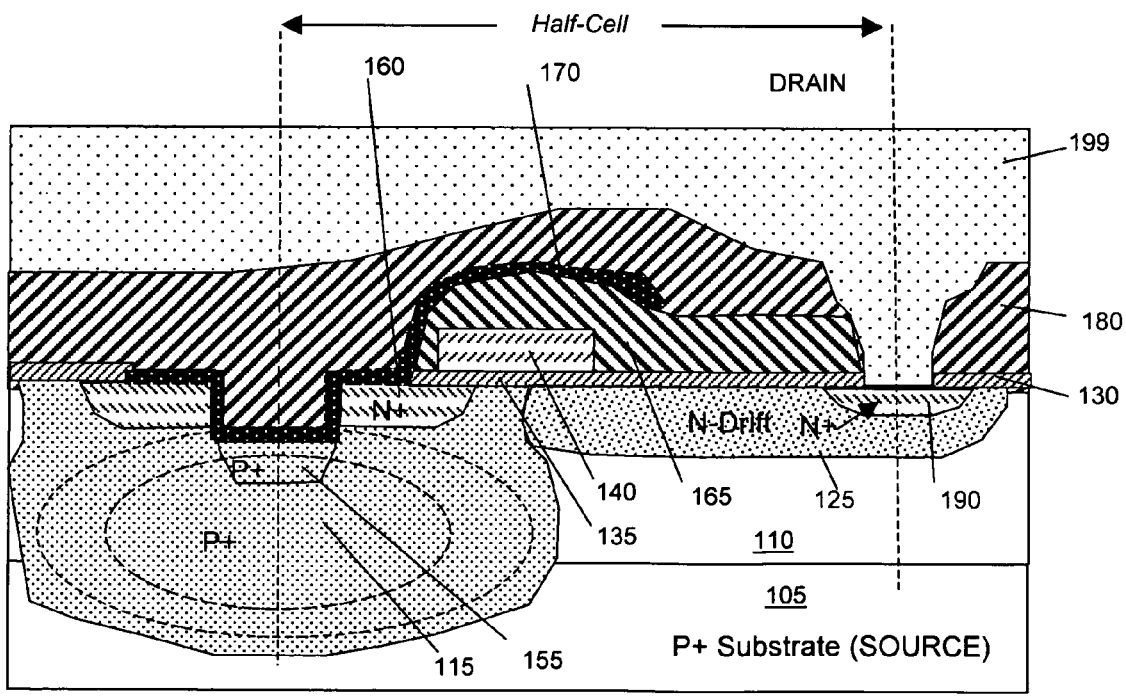
FIG. 4 is a cross sectional view of a planar short gate BSLDMOS device with a single TiN/TiSix metallization contact as another embodiment of this invention.
Figure 5:
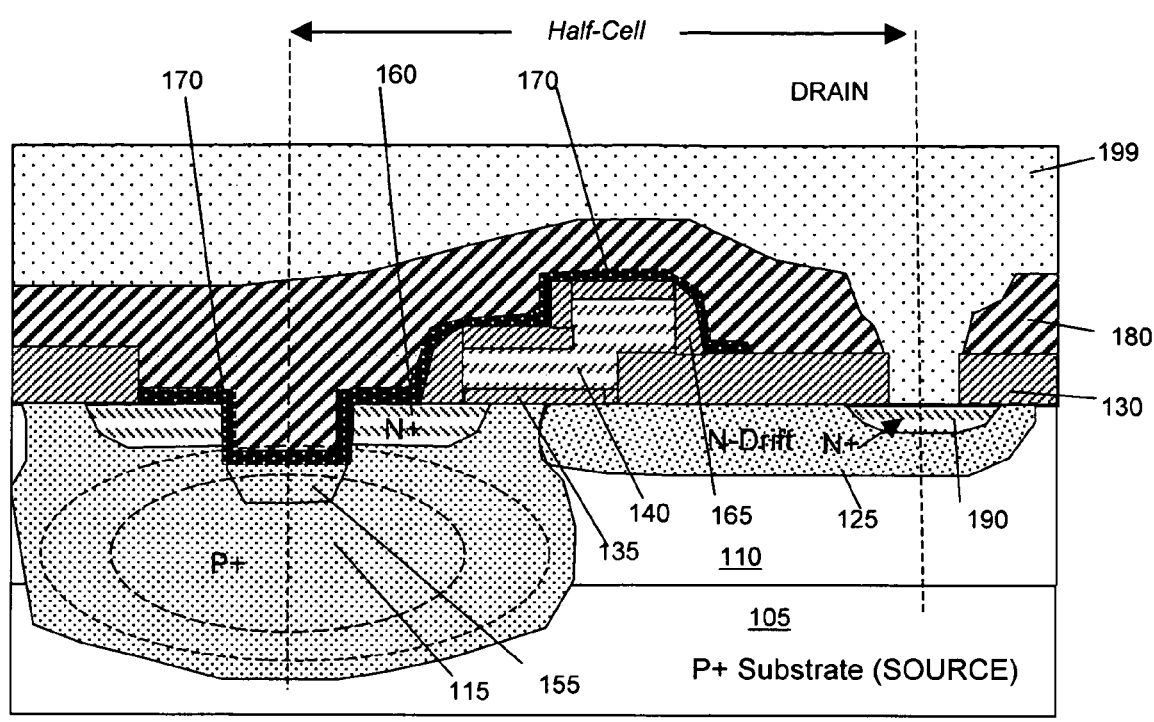
FIG. 5 is a cross sectional view of a planar short gate BSLDMOS device with a single barrier metal contact as another embodiment of this invention.

FIG. 3 is another exemplary embodiment of the BSLD-MOS device that is similar to the device shown in FIG. 2. The only difference is the gate 140 is formed as a short planar gate. FIG. 4 is another exemplary embodiment of the BSLDMOS device similar to the device shown in FIG. 3. The only difference is the contact metal and the gate shield metal layer is formed as a single metal layer 170. A thin TiN/TiSix silicide metallization process is applied to form the metal layer 170. Alternate metal layers, including tungsten silicide (WSix), patterned TiSi2 or CoSi and etc., can be used to form layer 170. FIG. 5 is another exemplary embodiment of the BSLD-MOS device that is similar to the device shown in FIG. 2. The only difference is the contact metal and the gate shield metal layer is formed as a single metal layer 170. A thin TiN/TiSix silicide metallization process is applied to form the metal layer 170.

According to above device configuration, a key feature of the structure is the ability to achieve low capacitance by compensating some of the N dopant in the accumulation layer, away from the silicon surface, by the deep sinker implant through the lateral diffusion of the sinker region 115 to the substrate below the drift region and the N-drain region.

Figure 6A:
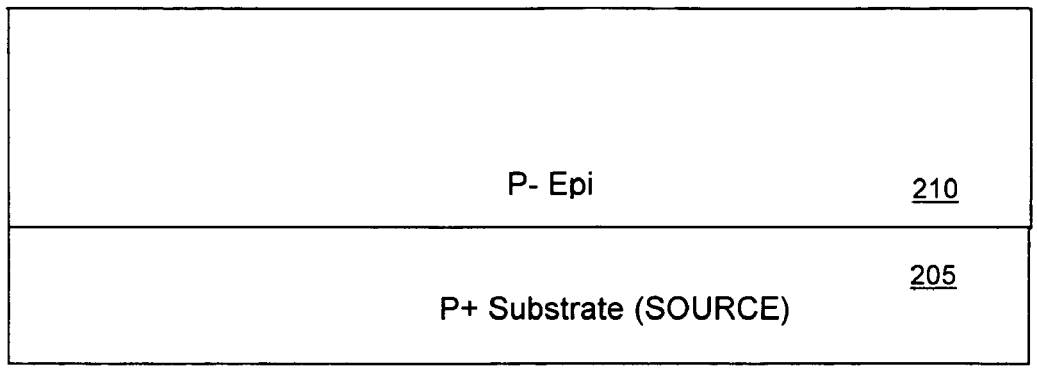
FIG. 6A to 6M are a serial cross sectional views for describing the manufacturing processes to fabricate a BS-LDMOS device of this invention.
Figure 6B:
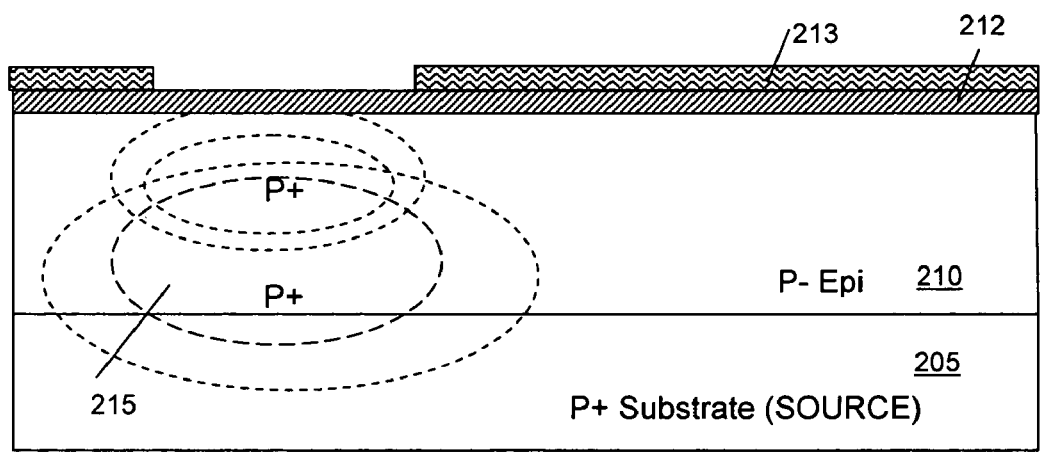
Figure 6C:
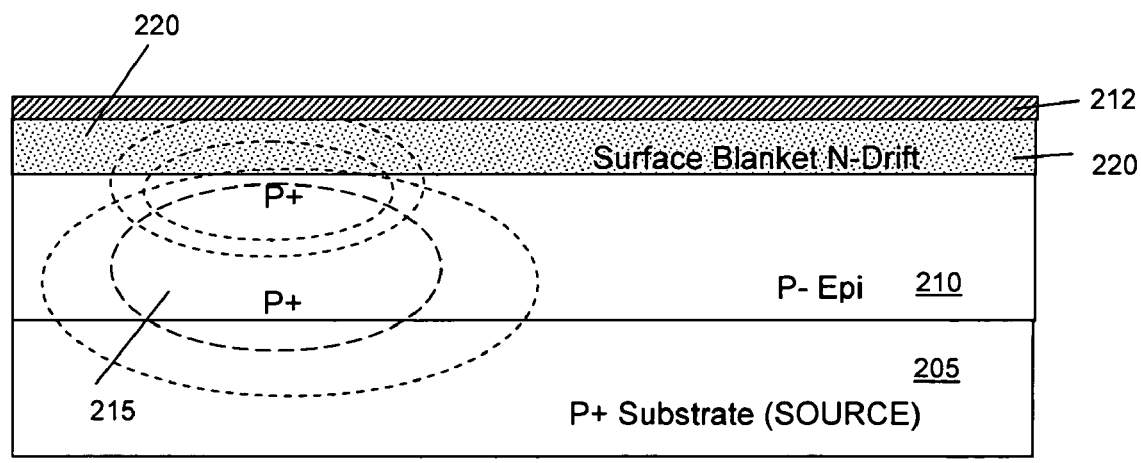
Figure 6D:
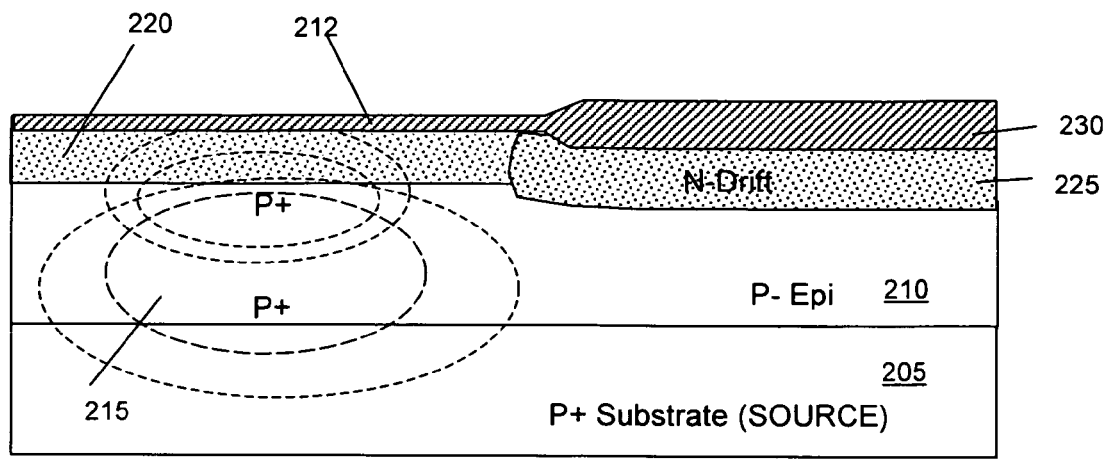

Referring to FIGS. 6A to 6M for a serial of side cross sectional views to illustrate the fabrication steps of a BSLD-MOS device as that shown in FIG. 5. In FIG. 6A, a starting silicon substrate that includes a P+ substrate 205 doped with Boron with a resistivity of 3 to 5 mOhm-cm or a lower resistivity. The substrate 205 is preferably along a <100> crystal orientation as a standard prime. A P-epitaxial layer 210 supported on the substrate 205 with a thickness ranging from 2 to 7 micrometers typically doped with a low dosage of 5E14 to 5E15 for 20-60 volts application. In FIG. 6B, a pad oxide layer 212 is grown. A thick resist sinker mask (not shown) is applied as a first mask to carry out deep sinker multiple energy implantations with an implanting dosage ranging from 1E14 to 5E15 at energy of 180-360 Kev. Optionally, the sinker implant can be performed with higher energy greater than 500 Kev at an implanting dose of 1E14 to form the sinker P+ sinker region 215. Formation of P+ sinker region 215 by multiple energy implantations minimizes lateral diffusion therefore reduce the pitch size. The implantation energy depends on the breakdown voltage as that required by the specification of a device because of the EPI thickness. Then the resist (not shown) is stripped followed by a sinker drive to thermally diffuse the sinker region 215. In FIG. 6C, a blanket N-drift (LDD) surface implant with arsenic or phosphorous ions is performed at a dose ranging from 5E11 to 5E12. For a reduced junction depth, an As implant may be applied. For lowest capacitance, Phosphorous is preferred. In FIG. 6D, a nitride deposition is carried out to protect the channel region and expose the drain extension region during the subsequent processing, and patterned using a mask. An optional N-drift implant can be performed using arsenic or phosphorus, in the regions not protected by nitride at a zero degree tilt with an implanting energy ranging between 80 Kev to 200 Kev and a dosage ranging from 1E12 to 3E13 and preferably a dosage of 4E12. This optional step results in a self-aligned n-type drift implant (for NMOS) in the drift drain extension of the LDMOS device, region 225. This is followed by a standard field oxidation process (referred to as LOCOS) to form region 230. Temperature can be in the range of 900 to 1100° C. to grow an oxide with a thickness in the 0.3 to 1 micron range, with a preferred thickness of about 0.5 microns.

Figure 6E:
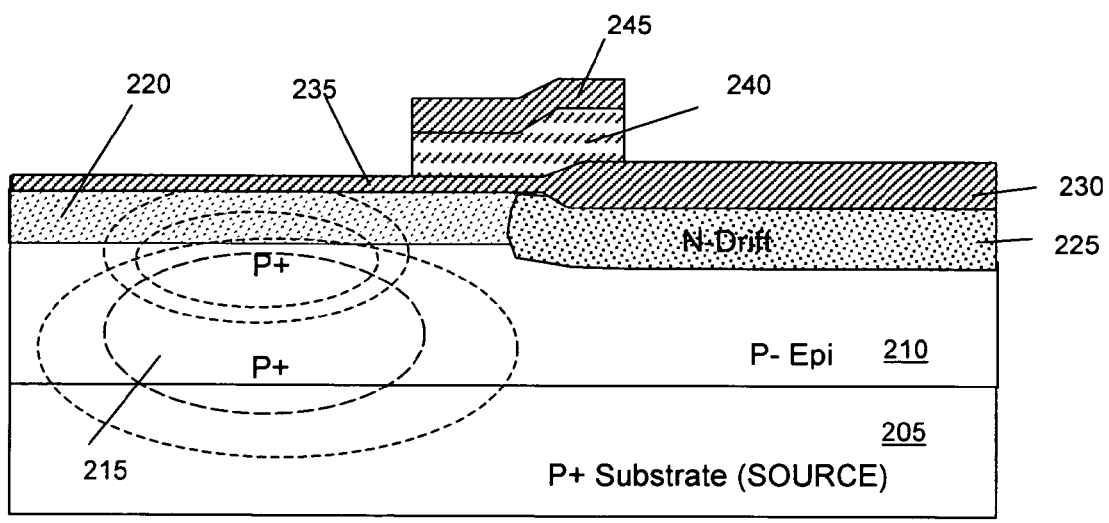

In FIG. 6E, nitride (not shown) and the pad oxide 212 are stripped followed by a sacrificial layer growth and strip (not shown). A gate oxide layer 235 is grown followed by depositing a polysilicon layer or preferably a polycide layer 240 having a thickness up to 2000 Angstroms. Then the N+ dopant ions are implanted to the Polysilicon layer and an optional WSix layer is formed on top for providing a low gate resistance contact layer. Note the poly can be in situ doped or doped using POCl$_3$ as well. An oxide cap deposition by using a HTO or LTO process is carried out to deposit an oxide cap layer 245. The oxide cap layer 245 has a thickness of about 500 to 4500 Angstroms on top of the gate layer. A gate mask, i.e., a third mask (not shown) is applied to etch and pattern the oxide cap layer 245 and the gate layer 240. An oxide etch is first performed to pattern the oxide cap layer 245 followed by a polysilicon or polycide etch. The polysilicon or polycide etch is stopped on top of the gate oxide layer 235 and the field oxide 230 as shown.

Figure 6F:
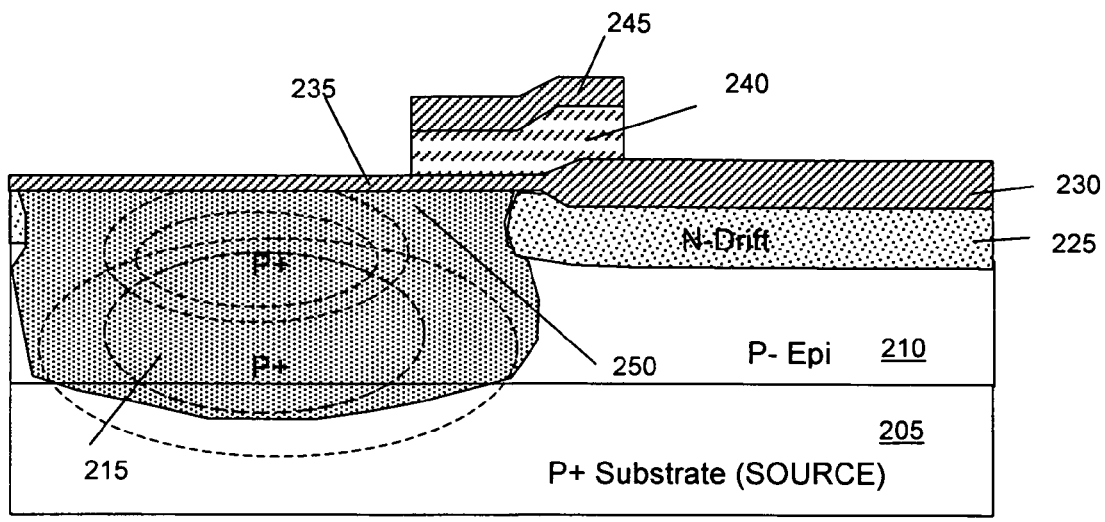
Figure 6G:
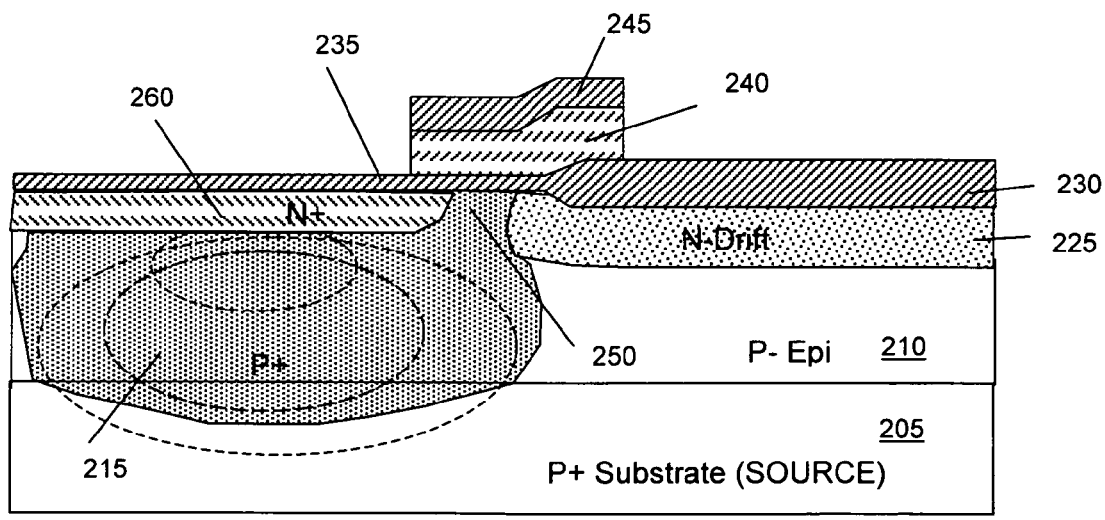
Figure 6H:
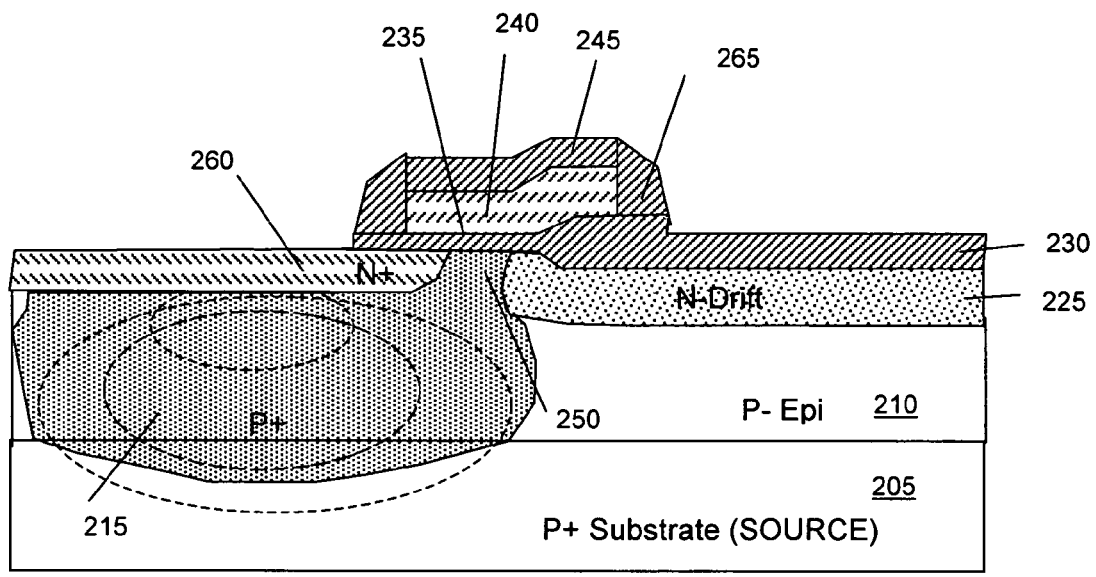
Figure 6I:
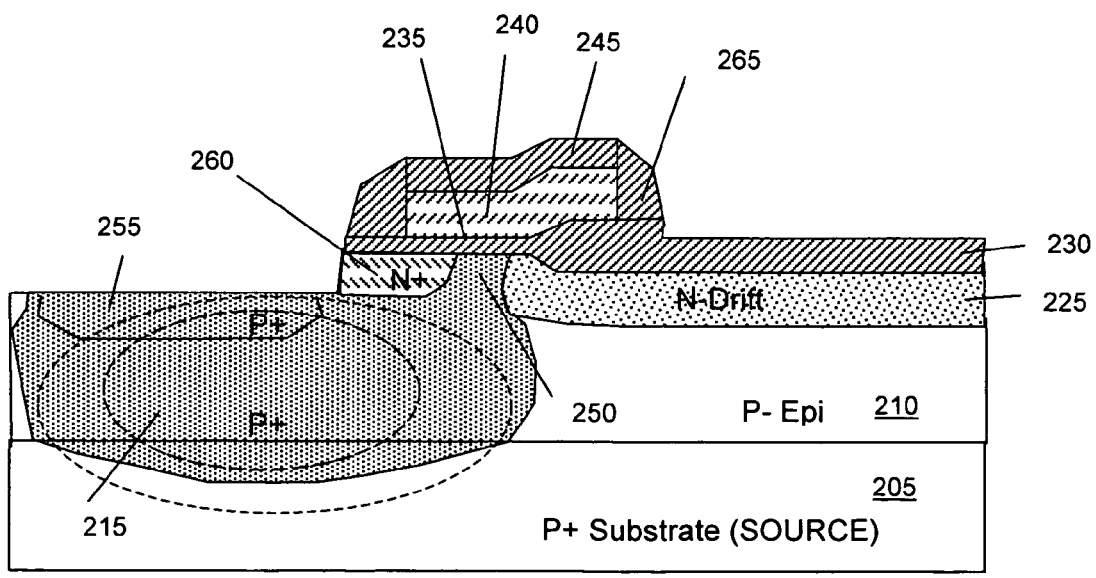
Figure 6J:
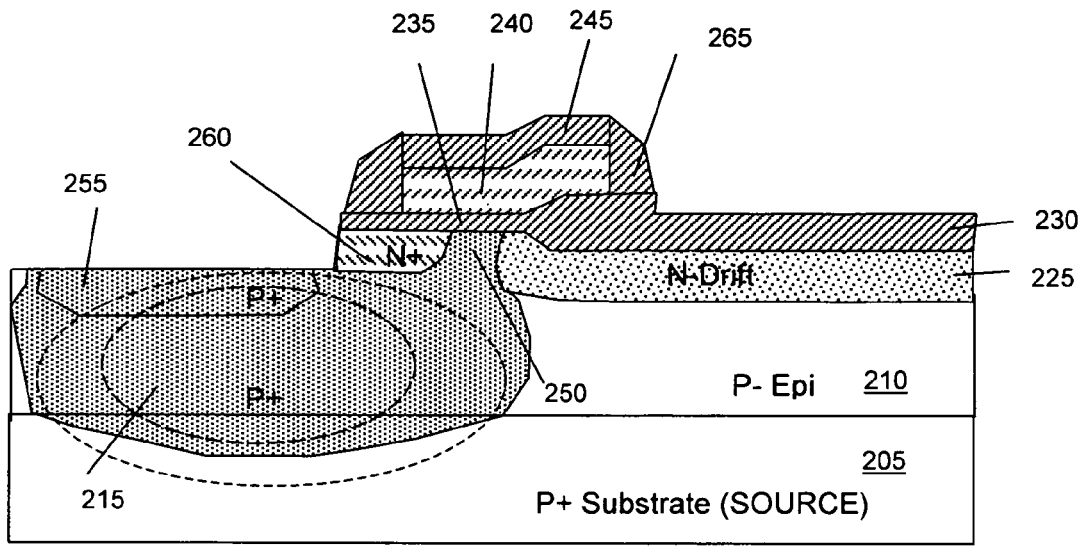
Figure 6K:
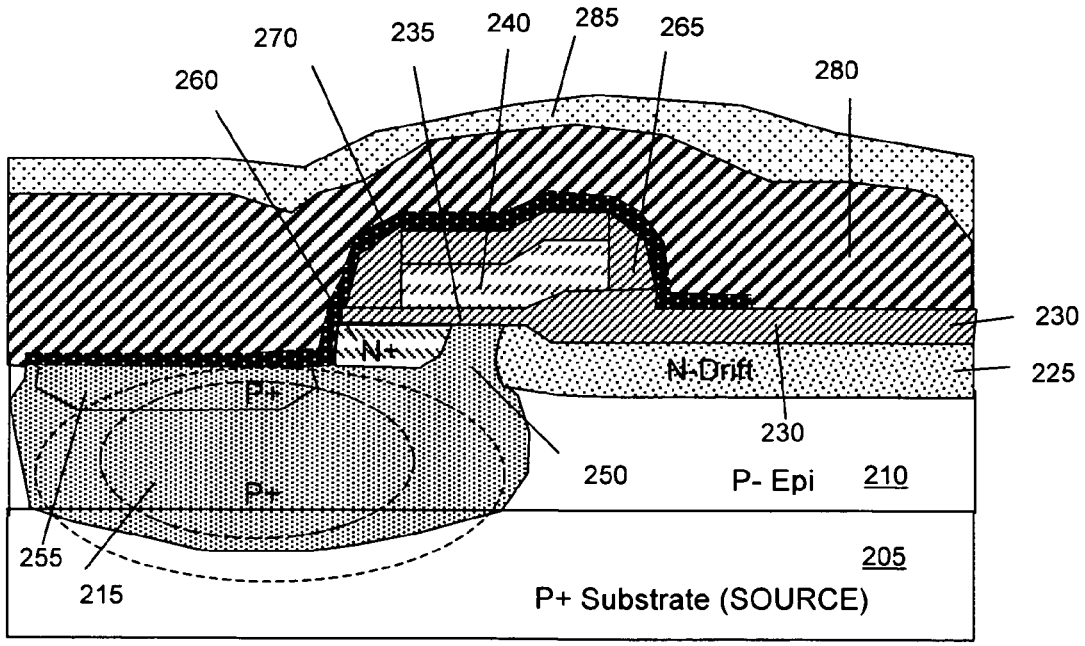
Figure 6L:
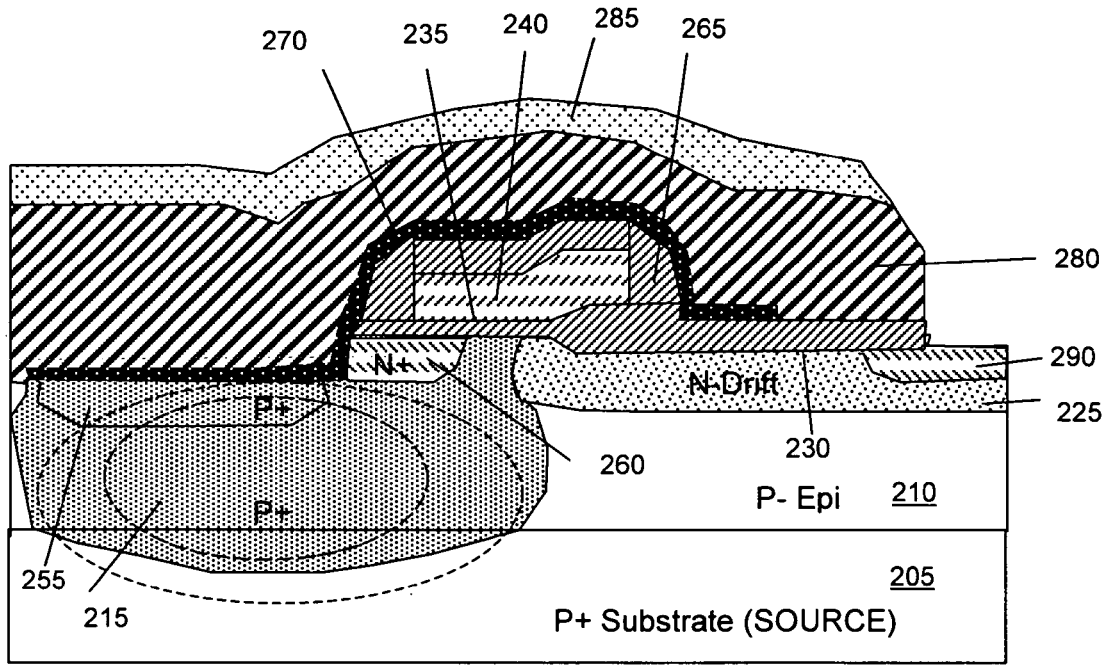

In FIG. 6F, a blanket shallow boron channel implant with a dosage range between 1E12 to 1E14 and preferably at a dose of 4E13 is carried out to form the P-channel 250. With the field oxide 225 and the gate 240 and oxide cap 245 stack-structures, the boron ions are implanted only in the source side of the gate. Then a channel drive is performed with an elevated temperature ranging between 950 to 1150 degrees Celsius and preferably at 1050 degree Celsius for approximately 30 minutes. In FIG. 6G, a blanket shallow source-implant with As dopant ions with a dosage ranging between 1E15 to 1E16 and preferably at 4E15 is carried out to form N+ source region 260. Then a source annealing operation at an elevated temperature ranging between 850° C. to 1000° C. and preferably 950° C. is performed for 30 minutes. Some oxygen may be used during the source anneal annealing process depending on the gate stack. In FIG. 6H, a spacer oxide layer is deposited with a conformal oxide layer having a thickness ranging between 1000 to 4000 Angstroms. Then a reactive ion etch (RIE) is performed to form the gate spacer 265 as passive gate sidewalls with minimal over etch to assure that there is oxide layer 235 left below the polysilicon gate 240. With the removal of the top oxide layer, the source region 260 is exposed. In FIG. 6I, a body/source short mask (not shown) as the fourth mask is employed to carry out an oxide etch followed by an silicon etch. The etch depth is equivalent to the junction depth of the source junction depth to remove the exposed source region and leaving the source region 260 only under the gate and the gate spacers 265. Then an optional shallow boron implant is carried out to form the shallow P+ region 255 as contact implant with an implant dose >1E14. The implanting ions can be either boron ions or BF2 ions or both. Then the photoresist is stripped. In FIG. 6J, A Ti/TiN layer 270 includes a Ti layer of about 100-300 Angstroms and TiN having a thickness of about 500 to 2500 Angstroms is deposited to function as body/source short and gate shield metal. The metal layer can also be alternately formed with a Wsix or W layer as high temperature compatible metal layer. Then a rapid thermal process (RTP) annealing process is performed at approximately 650-850° C. in N2 gas is performed for about 20 to 60 seconds. Then a gate shield metal mask as the fifth mask (not shown) is applied to carry out a Ti/TiN etch to pattern the Ti/TiN layer followed by stripping the mask. In FIG. 6K, an undoped oxide layer or a SiON layer is deposited with a thickness between 250 to 1000 Angstroms followed by depositing a BPSG insulation layer 280 having a thickness of 1500 to 10000 Angstroms. A reflow process is performed at a temperature of about 850° C. Then, an optional passivation layer 285 is deposited on top. The passivation layer can be a Si3N4, oxynitride, an oxide nitride or a SiON layer. In FIG. 6L, a drain and gate mask (not shown) as the fifth mask is applied to etch the passivation layer followed by an oxide etch down to the silicon to form the contact openings for gate and drain contact. Passivation under metal allows for the elimination of one mask in the process, the bond pad opening mask. A low energy contact implant with phosphorus ions with an implant dosage between 5E14 to 1E 16 is performed to form the low resistance contact regions 290 followed by an annealing process preferably using RTA with temperature between 700-900° C. in N2 and for a time of 20 sec to 5 minutes, preferably 1 minute.

Figure 6M:
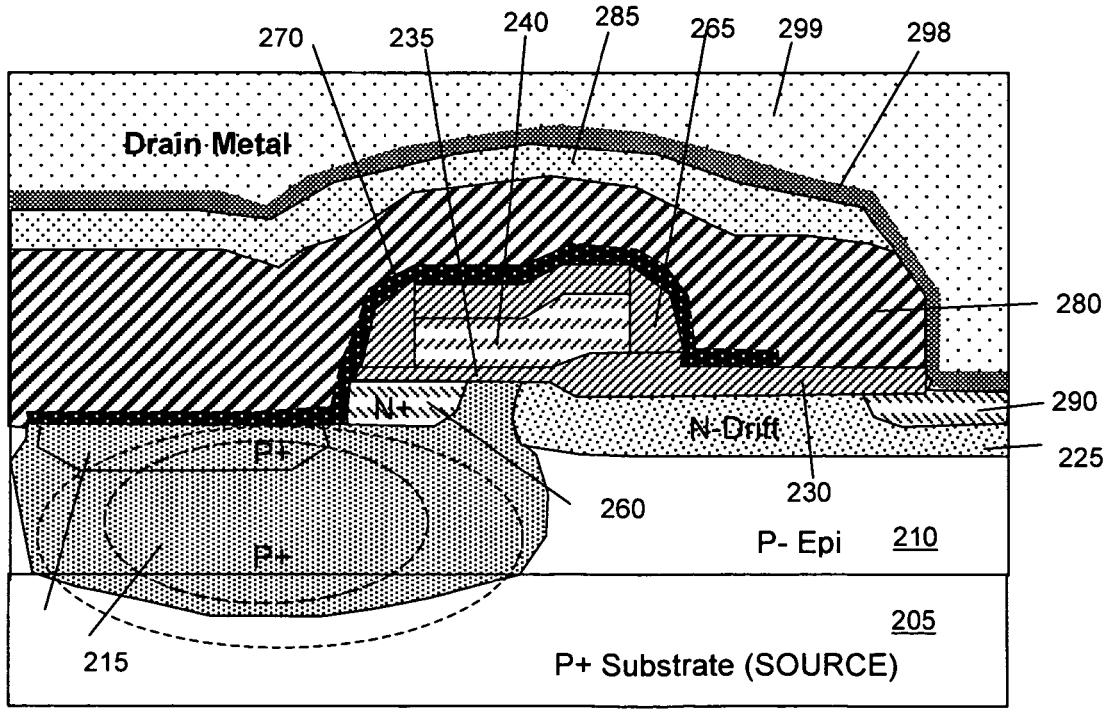
Figure 7A:
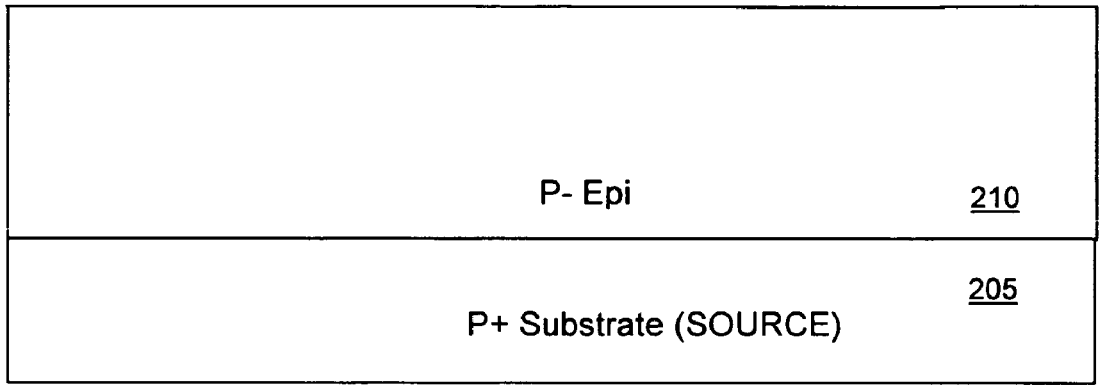
FIG. 7A to 7L are a serial cross sectional views for describing the manufacturing processes to fabricate another BS-LDMOS device of this invention.
Figure 7B:
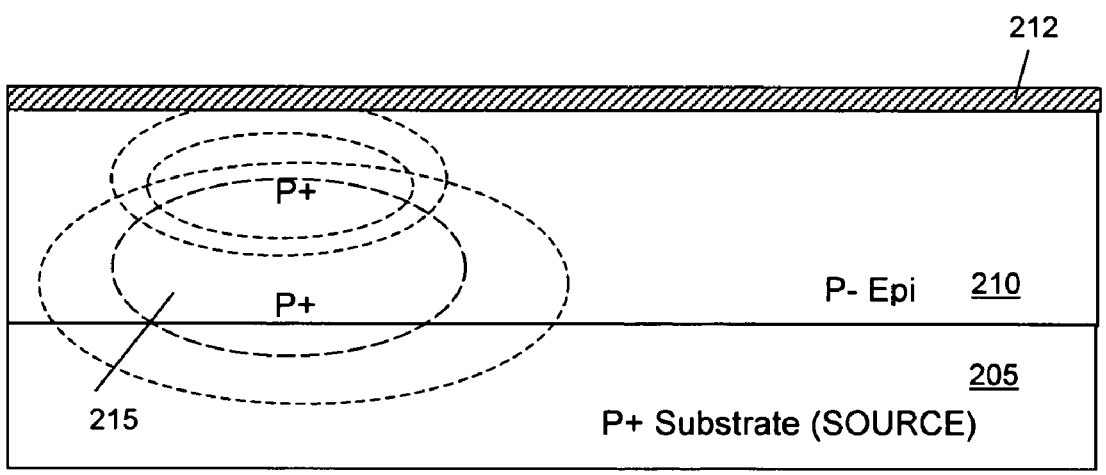
Figure 7C:
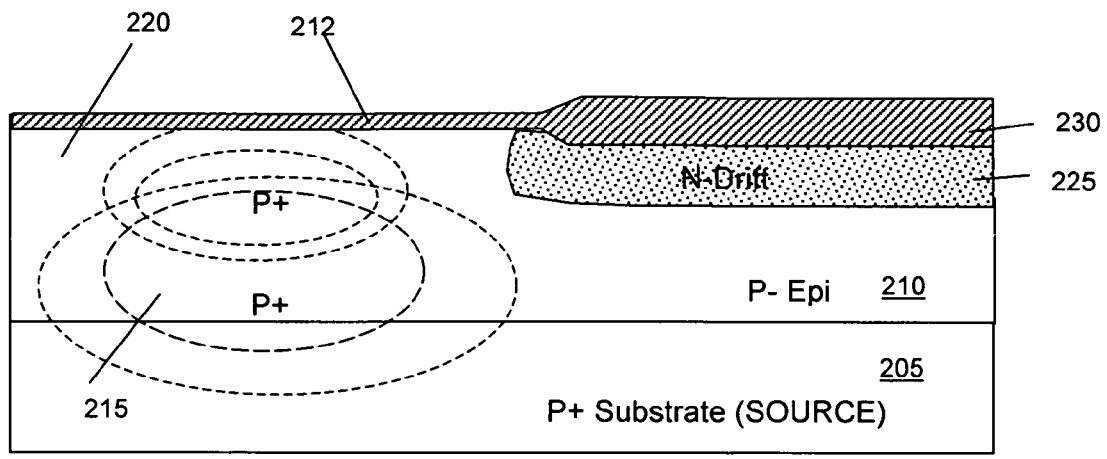
Figure 7D:
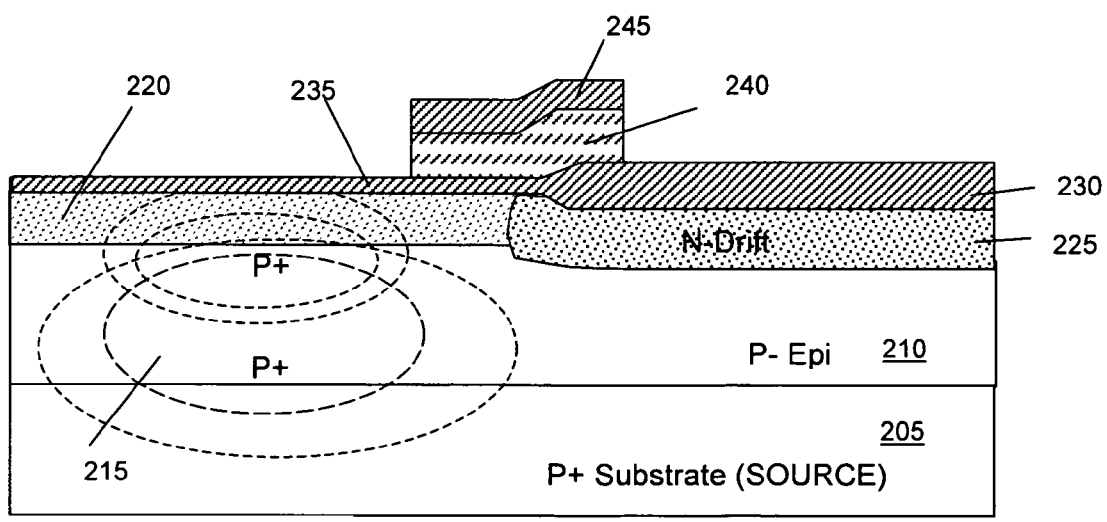

In FIG. 6M, a metal barrier Ti/TiN layer 298 and aluminum layer 299 are deposited followed by a applying a metal mask as the sixth mask to etch the metal layer 298. The metal mask (not shown) is removed. If the optional passivation layer described above was not deposited over the BPSG, a standard passivation process consisting of passivation deposition and the patterning of the passivation to open contact and bond pad regions can then be used to complete the device fabrication FIGS. 7A to 7L shows a five mask process that employs five masks include active mask, sinker implant mask, gate mask, contact mask and metal mask. The simpler version of the device may have a potential shortcoming due to a higher capacitance Crss/Cgd as there is no gate shield in this device configuration. In FIG. 7A, a starting silicon substrate that includes a P++ substrate 205 doped with Boron with a resistivity of 3 to 5 mOhm-cm or a lower resistivity. The substrate is 205 preferably along a <100> crystal orientation as a standard prime. A P-epitaxial layer 210 supported on the substrate 205 with a thickness ranging from 2 to 7 micrometers typically doped with a low dosage of 5E14 to 5E15 for 20-60 volts application. In FIG. 7B, a pad oxide layer 212 is grown. A thick resist sinker mask (not shown) is applied as a first mask to carry out deep sinker multiple energy implantations with an implanting dosage ranging from 1E14 to 5E15 at energy of 180-360 Kev. Optionally, the sinker implant can be performed with higher energy greater than 500 Kev at an implanting dose of 1E14 to form the sinker P+ sinker region 215. Then the resist (not shown) is stripped followed by a sinker drive to thermally diffuse the sinker region 215. A blanket N-drift (LDD) surface implant with arsenic or phosphorous ions is then performed at a dose ranging from 5E11 to 5E12. For a reduced junction depth, an As implant may be applied. For lowest capacitance, Phosphorous is preferred. In FIG. 7C, a nitride deposition is carried out to protect the channel region and expose the drain extension region during the subsequent processing and patterned using a mask. An optional N-drift implant can be performed using arsenic or phosphorus, in the regions not protected by nitride at a zero degree tilt with an implanting energy ranging between 80 Kev to 200 Kev and a dosage ranging from 1E12 to 3E13 and preferably a dosage of 4E12. This optional step results in a self-aligned n-type drift implant (for NMOS) in the drift drain extension of the LDMOS device, region 225. This is follow by a standard field oxidation process (referred to as LOCOS) to form region 230. Temperature can be in the range of 900 degrees to 1100 degrees Celsius to grow an oxide with a thickness of approximately 0.3 to 1.0 micrometer with a preferred thickness of about 0.5 micrometers. In FIG. 7D, the pad oxide plus nitride is stripped followed by a sacrificial layer growth and strip (not shown). A gate oxide layer 235 is grown followed by depositing a polysilicon layer or preferably a polycide layer 240 having a thickness of 500 to 2000 Angstroms. Then the N+ dopant ions are implanted to the PolySi layer and an optional Wsix layer is formed on top for providing a low gate resistance contact layer. An oxide cap deposition by using a HTO or LTO process is carried out to deposit an oxide cap layer 245. The oxide cap layer 245 has a thickness of about 500 to 4500 Angstroms on top of the gate layer. A gate mask, i.e., a third mask (not shown) is applied to etch and pattern the oxide cap layer 245 and the gate layer 240. An oxide etch is first performed to pattern the oxide cap layer 245 followed by a polysilicon or polycide etch. The polysilicon or polycide etch is stopped on top of the gate oxide layer 235 and the field oxide 230 as shown.

Figure 7E:
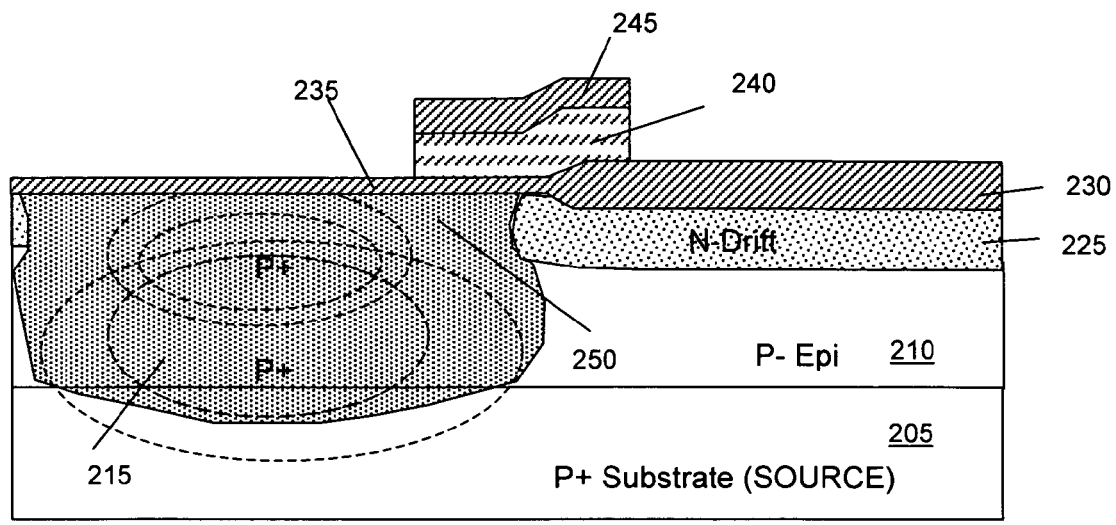
Figure 7F:
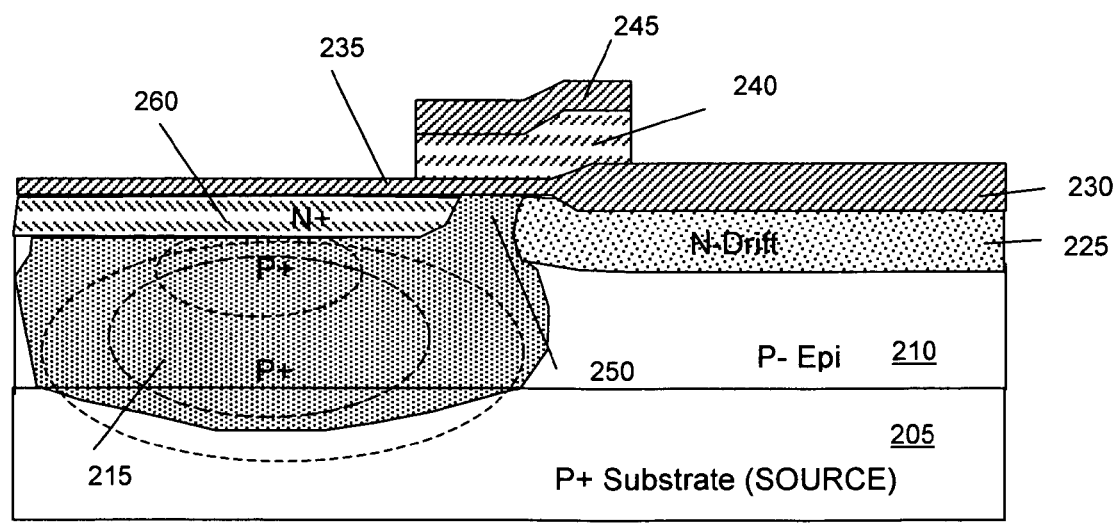
Figure 7G:
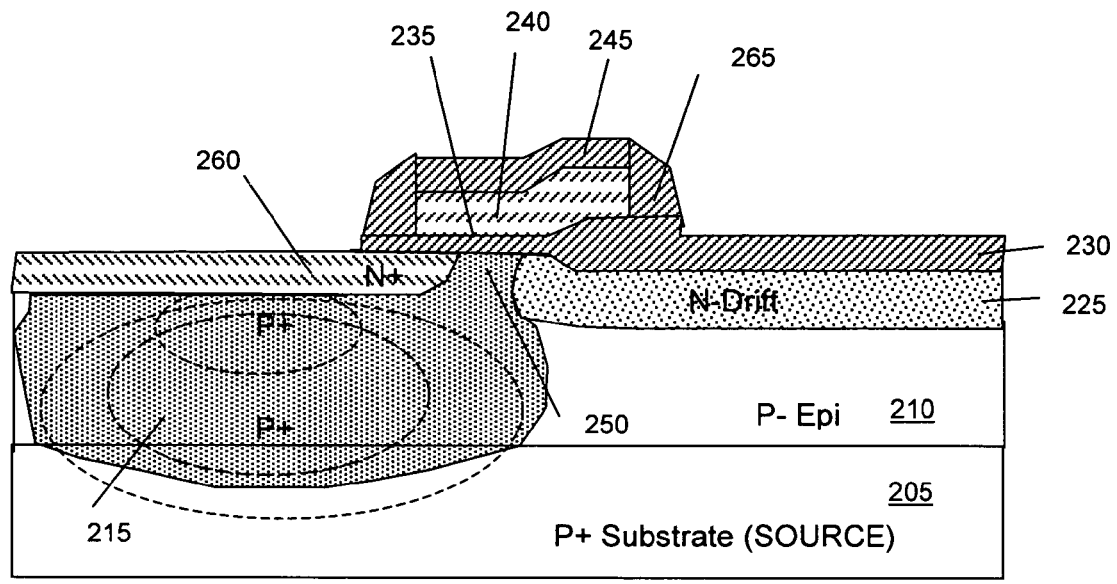
Figure 7H:
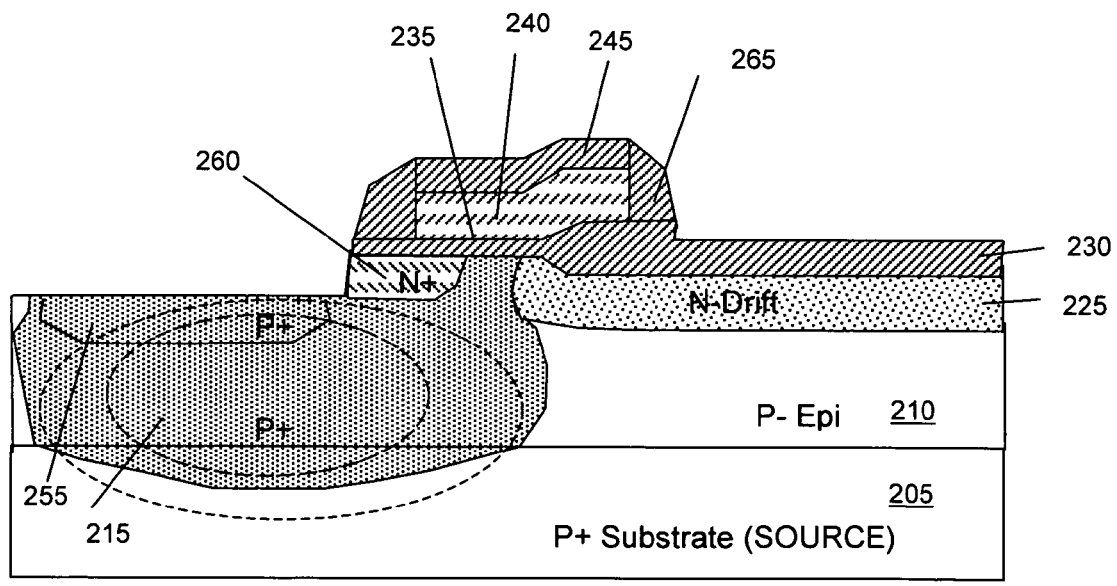
Figure 7I:
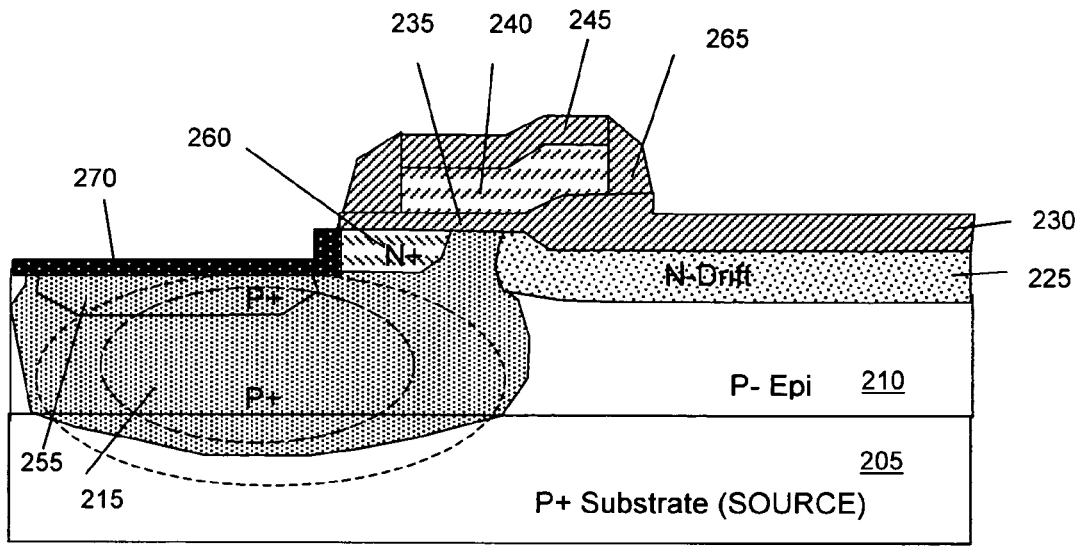
Figure 7J:
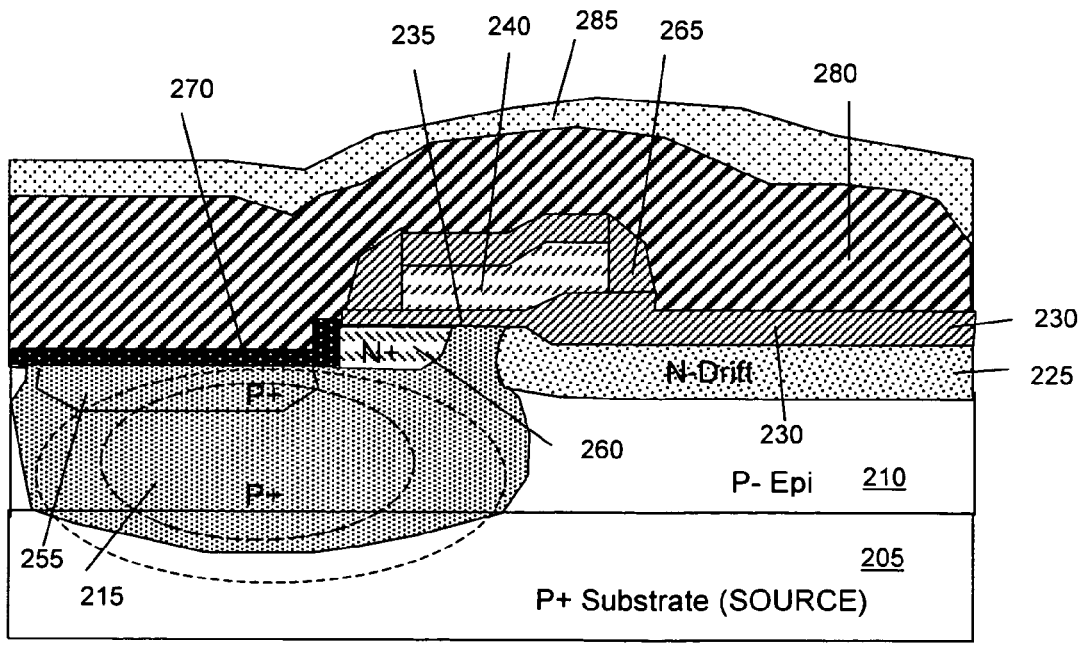
Figure 7K:
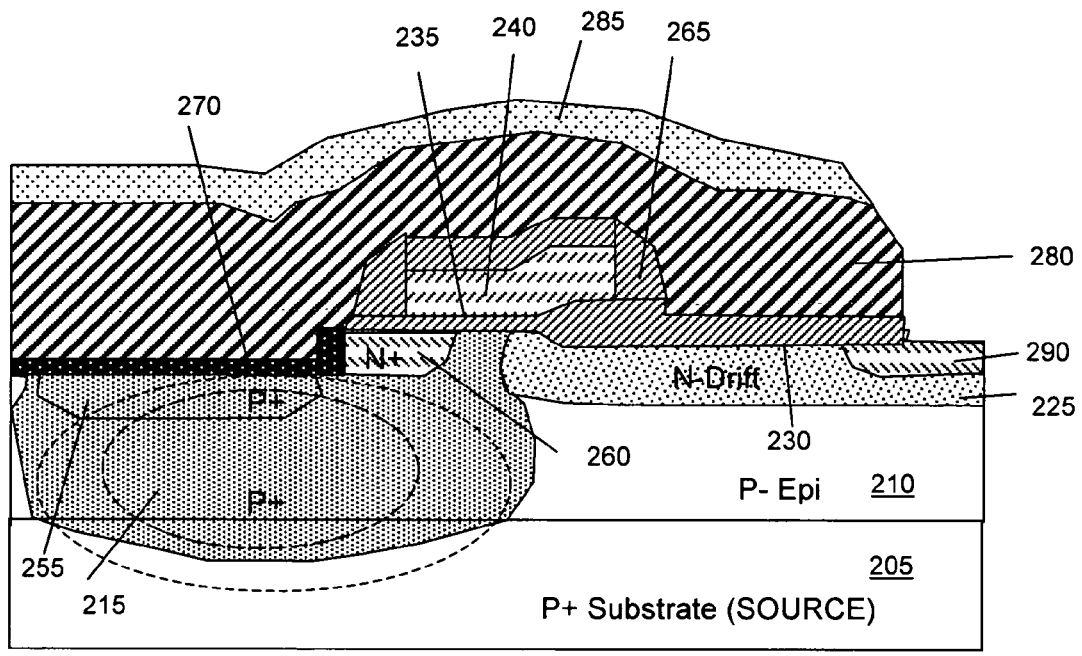
Figure 7L:
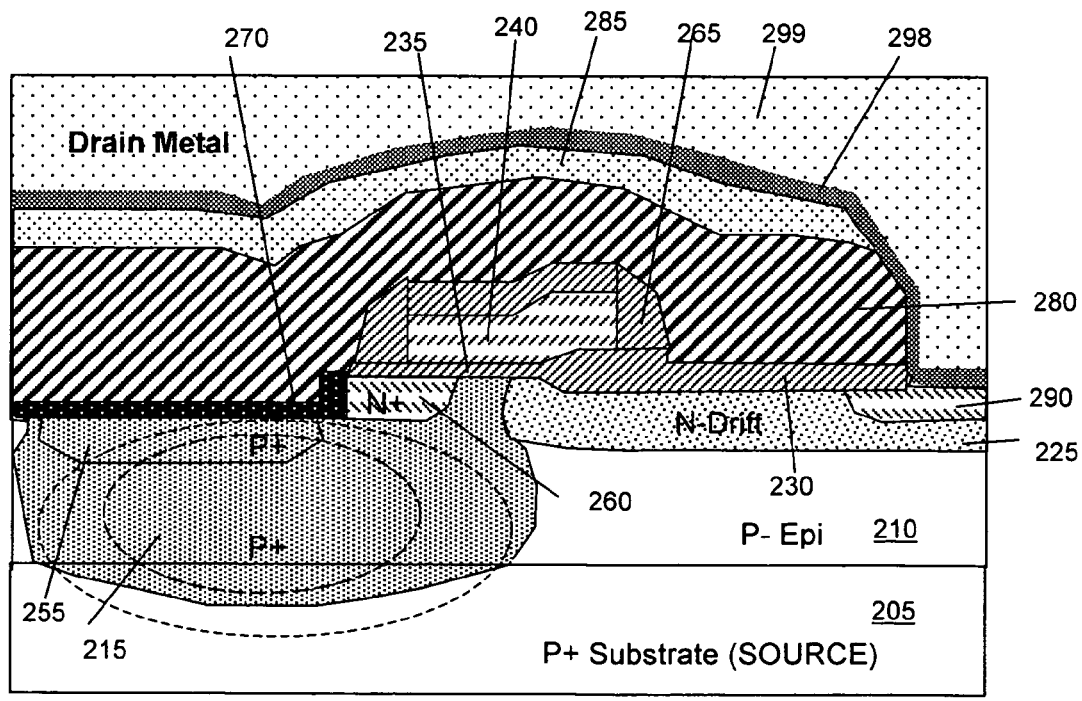

In FIG. 7E, a blanket shallow boron channel implant with a dosage range between 1E12 to 1E14 and preferably at a dose of 4E13 is carried out to form the P-channel 250. With the field oxide 225 and the gate 240 and oxide cap 245 stack-structures, the boron ions are implanted only in the source side of the gate. Then a channel drive is performed with a elevated temperature ranging between 950 to 1150 degrees Celsius and preferably at 1050 degree Celsius for approximately 30 minutes. In FIG. 7F, a blanket shallow source-implant with arsenic As dopant ions with a dosage ranging between 1E15 to 1E16 and preferably at 4E15 is carried out to form N+ source region 260. Then a source annealing operation at an elevated temperature ranging between 850° C. to 1000° C. and preferably 950° C. is performed for 30 minutes. Some oxygen may be used during the source anneal annealing process depending on the gate stack. In FIG. 7G, a spacer oxide layer is deposited with a conformal oxide layer having a thickness ranging between 1000 to 4000 Angstroms. Then a reactive ion etch (RIE) is performed to form the gate spacer 265 as passive gate sidewalls with minimal over etch to assure that there is oxide layer 235 left below the polysilicon gate 240. With the removal of the top oxide layer, the source region 260 is exposed. In FIG. 7H, a blanket silicon etch is carried out to remove the exposed source region and leaving the source region 260 only under the gate and the gate spacers 265. Then an optional shallow bottom implant is carried out with boron ions to form the shallow bottom P+ region with an implant dose >1E14. The implanting ions can be either boron ions or BF2 ions or both. In FIG. 7I, a slight wet oxide etch is carried out to pull back the oxide layer 235 from the N+ source to provide better contact. A titanium (Ti) or cobalt (Co) metal contact layer 270 is deposited followed by a silicide formation process to form TiSi2 or CoSi2 for enhanced contact with reduced resistance. The processes form the self-aligned body source short at the silicide layer 270 without requiring a mask. In FIG. 7J, an undoped oxide layer or a SiON layer is deposited with a thickness between 250 to 1000 Angstroms followed by depositing a BPSG insulation layer 280 having a thickness of 1500 to 10000 Angstroms. A reflow process is performed at a temperature of about 850° C. Then, a passivation layer 285 is deposited on top. The passivation layer can be a Si3N4, oxynitride, an oxide nitride or a SiON layer. In FIG. 7K, a drain and gate mask (not shown) as the fourth mask is applied to etch the passivation layer followed by an oxide etch down to the silicon to form the contact openings for gate and drain contact. Passivation under metal allows for the elimination of one mask in the process, the bond pad-opening mask. A low energy contact implant with phosphorus ions with an implant dosage between 5E14 to 1E 16 is performed to form the low resistance contact regions 290, followed by an annealing process preferably using RTA with temperature between 700-900° C. in N2 and for a time of 20 sec to 5 minutes, preferably 1 minute. In FIG. 7L, a metal barrier Ti/TiN layer 298 and aluminum layer 299 are deposited followed by applying a metal mask as the sixth mask to etch the metal layer 298. The metal mask (not shown) is removed. If the optional passivation layer described above was not deposited over the BPSG, a standard passivation process consisting of passivation deposition and the patterning of the passivation to open contact and bond pad regions can then be used to complete the device fabrication According to above drawings and descriptions, this invention discloses a method to form a bottom-source lateral diffusion MOS (BS-LDMOS) device with a source region disposed laterally opposite a drain region near a top surface of a semiconductor substrate supporting a gate thereon between the source region and a drain region. The method includes a step of applying a sinker-channel mask for carrying out a deep sinker multiple energy implant in lower portion of an epitaxial layer to form a combined sinker-channel region to function as a buried source-body contact extending to and contacting a bottom of the substrate functioning as a bottom source electrode. The method further includes a step of surface blanket implanting a shallow drift region near a top surface of the substrate. In a preferred embodiment, the method further includes a step of forming a thick filed oxide layer and forming the gate having a portion above the thick field oxide whereby a gate capacitance is reduced. In a preferred embodiment, the method further includes a step of forming a thick filed oxide layer on one side of a top surface of the substrate and forming the gate having a portion above the thick field oxide for carrying out a self-aligned source implant to form a source region opposite the field oxide layer next to the gate above the combined sinker-channel region. In a preferred embodiment, the method further includes a step of forming the source region and drain region on opposite side of a gate by forming the source region near a top surface of the substrate above the combined sinker-channel region. The method further includes a step of diffusing the combined sinker-channel region for vertically extending to the source region near the top surface and to laterally extending to the epitaxial layer below the drain region whereby the combined sinker-channel region compensating the drain region for reducing a source-drain capacitance. In a preferred embodiment, the method further includes a step of forming the source region and drain region on opposite side of a gate by forming the source region near a top surface of the substrate above the combined sinker-channel region with the combined sinker-channel region laterally diffused and extending below the source region and drain region whereby a cell pitch of the BS-LDMOS is not impacted by a lateral diffusion of the combined sinker-channel region Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A method to form a bottom-source lateral diffusion MOS (BS-LDMOS) device with a source region disposed laterally opposite a drain region near a top surface of a semiconductor substrate supporting a gate thereon between said source region and a drain region, the method comprising:

applying a sinker-channel mask for carrying out a deep sinker multiple energy implant to form a combined sinker-channel region in lower portion of an epitaxial layer to function as a buried source-body contact extending to and contacting a bottom of said substrate functioning as a bottom source electrode.

2. The method of claim 1 further comprising:

blanket implanting a shallow drift region near a top surface of said substrate.

3. The method of claim 1 further comprising:

forming a thick filed oxide layer and forming said gate having a portion above said thick field oxide whereby a gate capacitance is reduced.

4. The method of claim 1 further comprising:

forming a thick filed oxide layer on one side of a top surface of said substrate and forming said gate having a portion above said thick field oxide for carrying out a self-aligned source implant to form a source region opposite said field oxide layer next to said gate above said combined sinker-channel region.

5. The method of claim 1 further comprising:

forming said source region and drain region on opposite side of a gate by forming said source region near a top surface of said substrate above said combined sinker-channel region; and diffusing said combined sinker-channel region for vertically extending to said source region near said top surface and to laterally extending to said epitaxial layer below said drain region whereby said combined sinker-channel region compensating said drain region for reducing a source-drain capacitance.

6. The method of claim 1 further comprising:

forming said source region and drain region on opposite side of a gate by forming said source region near a top surface of said substrate above said combined sinker-channel region with said combined sinker-channel region laterally diffused and extending below said source region and drain region whereby a cell pitch of said BS-LDMOS is not impacted by a lateral diffusion of said combined sinker-channel region.

* * * * *